US007342410B2

(12) United States Patent
Hsieh et al.

(10) Patent No.: US 7,342,410 B2
(45) Date of Patent: Mar. 11, 2008

(54) DISPLAY DEVICE AND PIXEL TESTING METHOD THEREOF

(75) Inventors: Kuan-Yun Hsieh, Taichung (TW); Jian-Shen Yu, Hsinchu (TW)

(73) Assignee: A U Optronics Corp., Hsin-Chu (TW)

( * ) Notice: Subject to any disclaimer, the term of this patent is extended or adjusted under 35 U.S.C. 154(b) by 40 days.

(21) Appl. No.: 11/404,865

(22) Filed: Apr. 17, 2006

(65) Prior Publication Data

US 2007/0146002 A1 Jun. 28, 2007

(30) Foreign Application Priority Data

Dec. 23, 2005 (TW) ............................ 94146193 A

(51) Int. Cl.
*G01R 31/00* (2006.01)

(52) U.S. Cl. ..................................................... 324/770

(58) Field of Classification Search ................ 324/765, 324/760, 770, 158.1; 349/38, 42, 52, 43; 345/89, 691, 92.98, 904

See application file for complete search history.

(56) References Cited

U.S. PATENT DOCUMENTS

| | | | | |
|---|---|---|---|---|
| 5,436,662 A * | 7/1995 | Nagasaki et al. | ........... | 348/312 |
| 6,265,889 B1 * | 7/2001 | Tomita et al. | .............. | 324/765 |
| 6,281,701 B1 | 8/2001 | Yang et al. | | |
| 6,879,179 B2 | 4/2005 | Fujita | | |
| 6,982,568 B2 | 1/2006 | Nojiri et al. | | |
| 2004/0174183 A1 | 9/2004 | Nojiri et al. | | |

FOREIGN PATENT DOCUMENTS

| | | |
|---|---|---|
| TW | 519612 | 2/2003 |
| TW | 522356 | 3/2003 |
| TW | 1220696 | 9/2004 |
| TW | 1229199 | 3/2005 |

* cited by examiner

*Primary Examiner*—Ha Tran Nguyen
*Assistant Examiner*—Tung X. Nguyen
(74) *Attorney, Agent, or Firm*—Bacon & Thomas, PLLC

(57) ABSTRACT

A display device has a display panel, which includes a plurality of IC pads, a plurality of data lines, a selector, a plurality of switches and a test pad. The IC pads are connected to the data lines through the selector. The data lines are electrically connected to a corresponding pixel circuit. The IC pads are connected to the test pad via the corresponding switch. The switches are sequentially turned on to sequentially transmit a voltage to the corresponding pixel circuit through the test pad.

7 Claims, 4 Drawing Sheets

DISPLAY DEVICE AND PIXEL TESTING METHOD THEREOF

This application claims the benefit of Taiwan patent application Ser. No. 94146193, filed Dec. 23, 2005, the subject matter of which is incorporated herein by reference.

BACKGROUND OF THE INVENTION

1. Field of the Invention

The invention relates in general to a liquid crystal display device, and more particularly to the test architecture for a liquid crystal display.

2. Description of the Related Art

FIG. 1 is a schematic illustration showing a test architecture for a conventional liquid crystal display panel 100. Referring to FIG. 1, the liquid crystal display panel 100 has a plurality of data lines DL(1) to DL(N) and a plurality of pixel circuits P, wherein N is a positive integer. The liquid crystal display panel 100 has a plurality of test pads TP(1) to TP(N), which corresponds to the data lines DL(1) to DL(N) and is used to test the pixel circuits P, on a glass substrate 102. For example, the display panel 100 has 2048 test pads TP(1) to TP(2048) if it has 2048 data lines DL(1) to DL(2048). These test pads TP(1) to TP(2048) receive pixel voltages to test each pixel circuit P and thus determine whether each pixel circuit is normal in the process of manufacturing the liquid crystal display panel 100, such as in the phase when the glass substrate 102 has been manufactured but the liquid crystal is not filled and the opposite glass substrate is not assembled (the procedure in the array manufacturing process). That is, the pixel voltages are sequentially transferred to the corresponding pixel circuits P through the 2048 test pads TP(1) to TP(2048) and the 2048 data lines DL(1) to DL(2048). Then, the voltage levels stored in the pixel circuits P are measured through the 2048 test pads TP(1) to TP(2048), respectively, and whether the functions of the pixel circuits P are normal can be detected.

Although the above-mentioned method can definitely detect whether the function of each pixel circuit P is normal, the problems in the high cost and the manufacturing difficulty exist. In other words, these problems are that the number of the test pads TP corresponding to the data lines DL greatly increases when the resolution is higher. The greater number of test pads TP increases the manufacturing cost of the glass substrate 102, and there is no sufficient space for the test probes to be inserted into the test pads, or there is even no sufficient space for accommodating these test pads TP on the glass substrate 102 because the density of the test pads TP is higher.

According to the consideration of the cost and the manufacturing difficulty, the actual number of test pads of the conventional display panel does not correspond to the number of the data lines in a one-to-one manner. In the prior art, some data lines share one test pad, such that the number of test pads disposed on the liquid crystal display panel is reduced. For example, three or six data lines share one test pad. However, this architecture cannot precisely detect whether each pixel circuit works normally when the glass substrate is manufactured, that is, when the liquid crystal is not filled in and the opposite glass substrate is not assembled. This architecture can only know that at least one pixel circuit among the pixels connected to the data lines corresponding to some test pad has a fault.

Thus, it is an important subject of the panel industry to solve the problem by precisely detecting the functions of the pixel circuits when the glass substrate is manufactured, and to solve the problems of the difficult tests or arrangements due to the too-high density of the test pads.

SUMMARY OF THE INVENTION

It is therefore an object of the invention to provide a test architecture for a display panel so as to solve the problems in the cost, the manufacturing difficulty, and the incapability of precisely detecting whether each pixel circuit works normally.

The invention achieves the above-identified object by providing a display device including a plurality of first signal lines, a plurality of second signal lines, a first main thin-film transistor set, a second main thin-film transistor set, a test pad, a first auxiliary thin film transistor and a second auxiliary thin film transistor. The first signal lines are electrically connected to corresponding pixel circuits, respectively. The second signal lines are electrically connected to the corresponding pixel circuits, respectively. The first main thin-film transistor set has a first main thin-film transistor and a second main thin-film transistor, each of which has a first terminal, a second terminal and a control terminal. The second main thin-film transistor set has another first main thin-film transistor and another second main thin-film transistor, each of which has a first terminal, a second terminal and a control terminal. The first terminals of the first main thin-film transistors are electrically connected to the first signal lines and the first terminals of the second main thin-film transistors are electrically connected to the second signal lines. The test pad receives power signals for driving the pixel circuits and outputs voltage levels stored in the pixel circuits.

The first auxiliary thin film transistor has a first terminal, a second terminal and a control terminal. The first terminal of the first auxiliary thin film transistor is connected to the second terminals of the first main thin-film transistor set. The second auxiliary thin film transistor has a first terminal, a second terminal and a control terminal. The first terminal of the second auxiliary thin film transistor is connected to the second terminals of the second main thin-film transistor set. The second terminals of the first auxiliary thin film transistor and the second auxiliary thin film transistor are coupled to the test pad, and the control terminals of the first auxiliary thin film transistor and the second auxiliary thin film transistor receive corresponding auxiliary control signals, respectively. The control terminals of the first main thin-film transistors receive a main control signal, and the control terminals of the second main thin-film transistors receive another main control signal. When the main control signal is enabled, the auxiliary control signals are sequentially enabled such that the first auxiliary thin film transistor and the second auxiliary thin film transistor are sequentially turned on. Similarly, when the another main control signal is enabled, the auxiliary control signals are sequentially enabled such that the first auxiliary thin film transistor and the second auxiliary thin film transistor are sequentially turned on.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides a test architecture for a display panel. The test architecture can correctly detect whether the function of each pixel circuit is normal when a glass substrate is manufactured, and can also solve the problems in the cost and manufacturing difficulty of a conventional test architecture using a conventional method.

Figure 1:
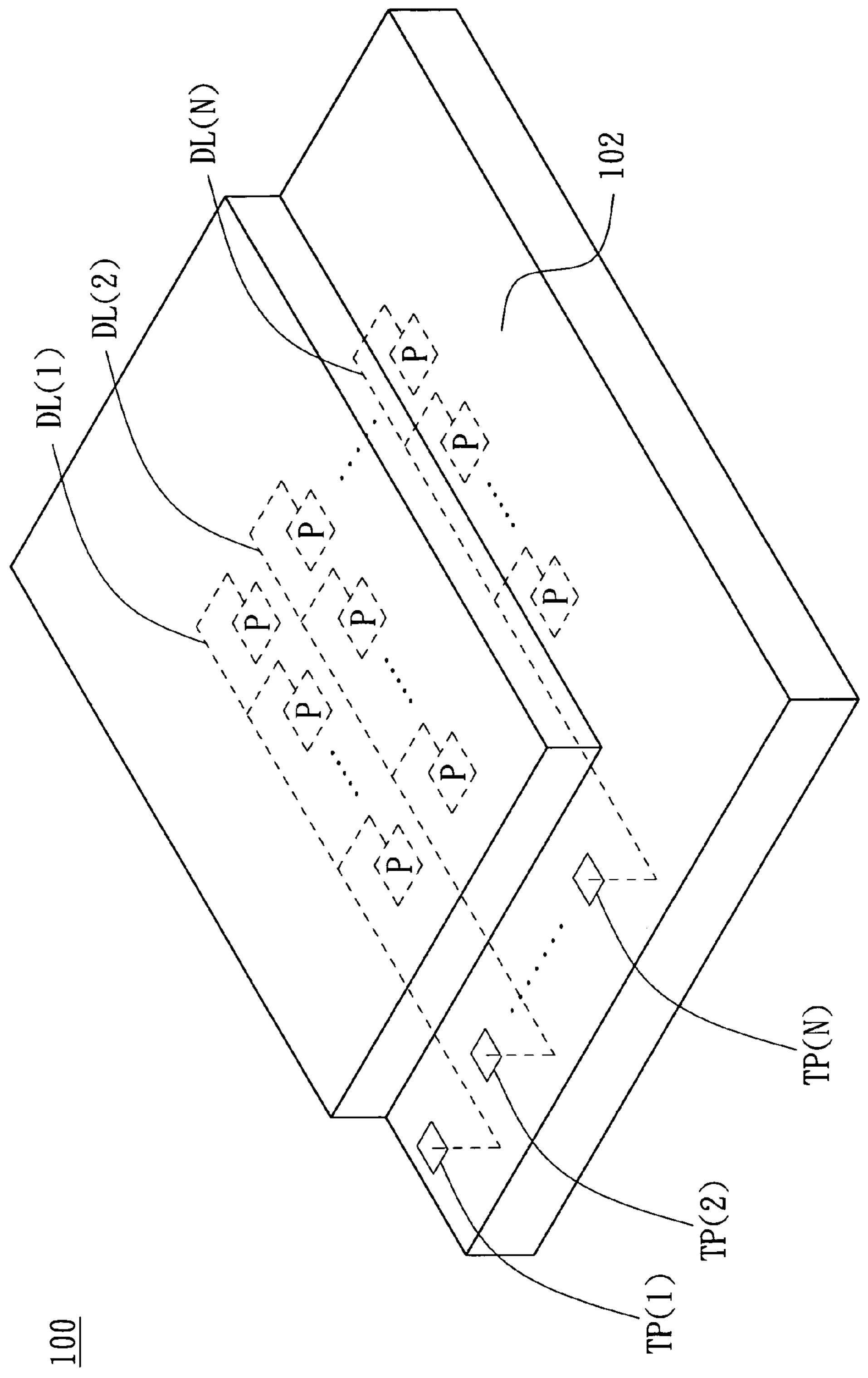
FIG. 1 (RELATED ART)
FIG. 1 is a schematic illustration showing a test architecture for a conventional liquid crystal display panel.
Figure 2:
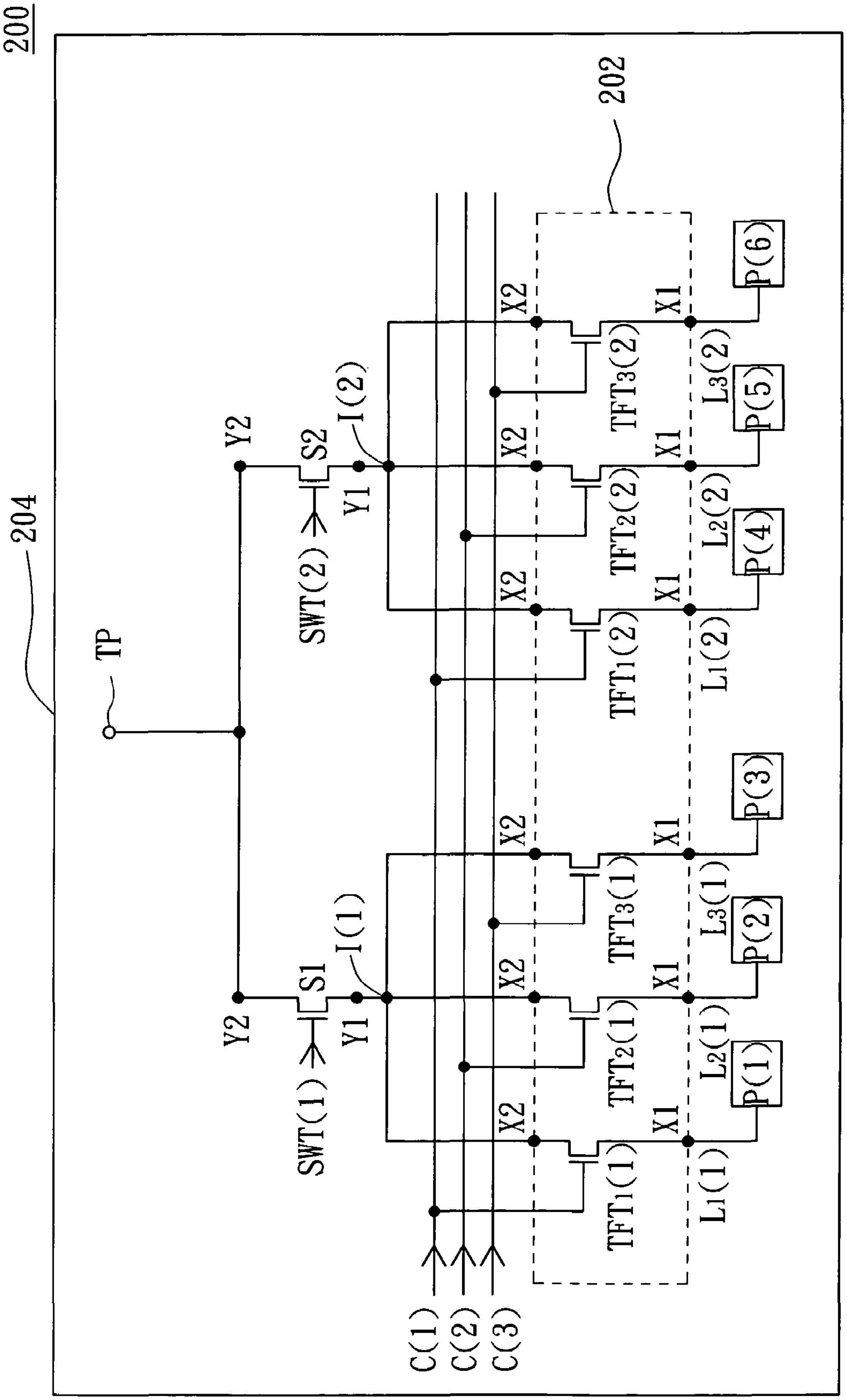
FIG. 2 is a schematic illustration showing a test architecture for a display device of this invention.

FIG. 2 is a schematic illustration showing a test architecture for a display device 200 of this invention. Referring to FIG. 2, the display device 200, such as a liquid crystal display, has a liquid crystal display panel (not shown). The liquid crystal display panel includes, for example, six signal lines L, six pixel circuits P(1) to P(6), a selector 202, a test pad TP, two IC (Integrated Circuit) pads I(1) and I(2), a first auxiliary thin film transistor $S_1$, a second auxiliary thin film transistor $S_2$ and a glass substrate 204. The six signal lines L include two first signal lines $L_1$(1) and $L_1$(2), two second signal lines $L_2$(1) and $L_2$(2) and two third signal lines $L_3$(1) and $L_3$(2). The selector 202 comprises six switches including, for example, two first main thin-film transistors $TFT_1$(1) and $TFT_1$(2), two second main thin-film transistors $TFT_2$(1) and $TFT_2$(2), and two third main thin-film transistors $TFT_3$(1) and $TFT_3$(2).

Each signal line L is a data line and disposed on the glass substrate 204. In FIG. 2, for example, each signal line L is depicted as being connected to one pixel circuit P. Each signal line L is coupled to a corresponding IC pad I through one main thin-film transistor TFT so as to receive, from the IC pad 1, a pixel voltage VP outputted from a data driving integrated circuit (not shown). That is, the IC pads I(1) and I(2) are IC pins to be connected to the data driving integrated circuit. As shown in FIG. 2, two first signal lines $L_1$(1) and $L_1$(2) are electrically connected to first terminals X1 of the corresponding two first main thin-film transistors $TFT_1$(1) and $TFT_1$(2), respectively. And the two second signal lines $L_2$(1) and $L_2$(2) are also electrically connected to first terminals X1 of the corresponding two second main thin-film transistors $TFT_2$(1) and $TFT_2$(2). The two third signal lines $L_3$(1) and $L_3$(2) are also electrically connected to first terminals X1 of the corresponding two third main thin-film transistors $TFT_3$(1) and $TFT_3$(2), respectively. Gates of the two first main thin-film transistors $TFT_1$(1) and $TFT_1$(2) receive a first main control signal C(1). Gates of the two second main thin-film transistors $TFT_2$(1) and $TFT_2$(2) receive a second main control signal C(2). Gates of the two third main thin-film transistors $TFT_3$(1) and $TFT_3$(2) receive a third main control signal C(3). Second terminals X2 of the three main thin-film transistors $TFT_1$(1), $TFT_2$(1) and $TFT_3$(1) are coupled to a first IC pad I(1), and second terminals X2 of the other three main thin-film transistors $TFT_1$(2), $TFT_2$(2) and $TFT_3$(2) are coupled to a second IC pad I(2).

A first terminal Y1 of the first auxiliary thin film transistor $S_1$ is coupled to the first IC pad I(1). A second terminal Y2 of the first auxiliary thin film transistor $S_1$ is coupled to the test pad TP. A gate of the first auxiliary thin film transistor $S_1$ receives an auxiliary control signal SWT(1). Correspondingly, the first terminal Y1 of the second auxiliary thin film transistor $S_2$ is coupled to the second IC pad 1(2). The second terminal Y2 of the second auxiliary thin film transistor $S_2$ is coupled to the test pad TP. The gate of the second auxiliary thin film transistor $S_2$ receives an auxiliary control signal SWT(2).

Descriptions will be made to explain how the invention can correctly detect whether the function of each pixel circuit P is normal, and solve the problem of the high cost and the test architecture manufacturing difficulty of a conventional liquid crystal display panel. First, the number of data driving units in the data driving integrated circuit can be decreased by using the selector 202, and the cost of the data driving integrated circuit can also be reduced effectively. The architecture of the display device 200 having the selector 202 corresponds a plurality of data lines L to one IC pad 1. For example, three signal lines $L_1$(1), $L_2$(1) and $L_3$(1) are coupled to the IC pad I(1). Thus, corresponding one IC pad I to one test pad can really reduce the number of test pads, but still cannot greatly reduce the number of test pads disposed on the glass substrate 204. Consequently, the invention further divides the plurality of IC pads (IC output pads) into several groups using another selector. For example, as shown in FIG. 2, the two IC pads I(1) and I(2) are divided into one group. That is, two IC pads I(1) and I(2) are coupled to one test pad TP through two auxiliary thin film transistors $S_1$ and $S_2$. Consequently, only one test pad TP is requested to test more pixel circuits P on more data lines L, and the number of the test pad TP disposed on the glass substrate 204 may be greatly reduced. As shown in FIG. 2, for example, the test pad TP can test six pixel circuits P(1) to P(6) on six data lines.

Figure 3:
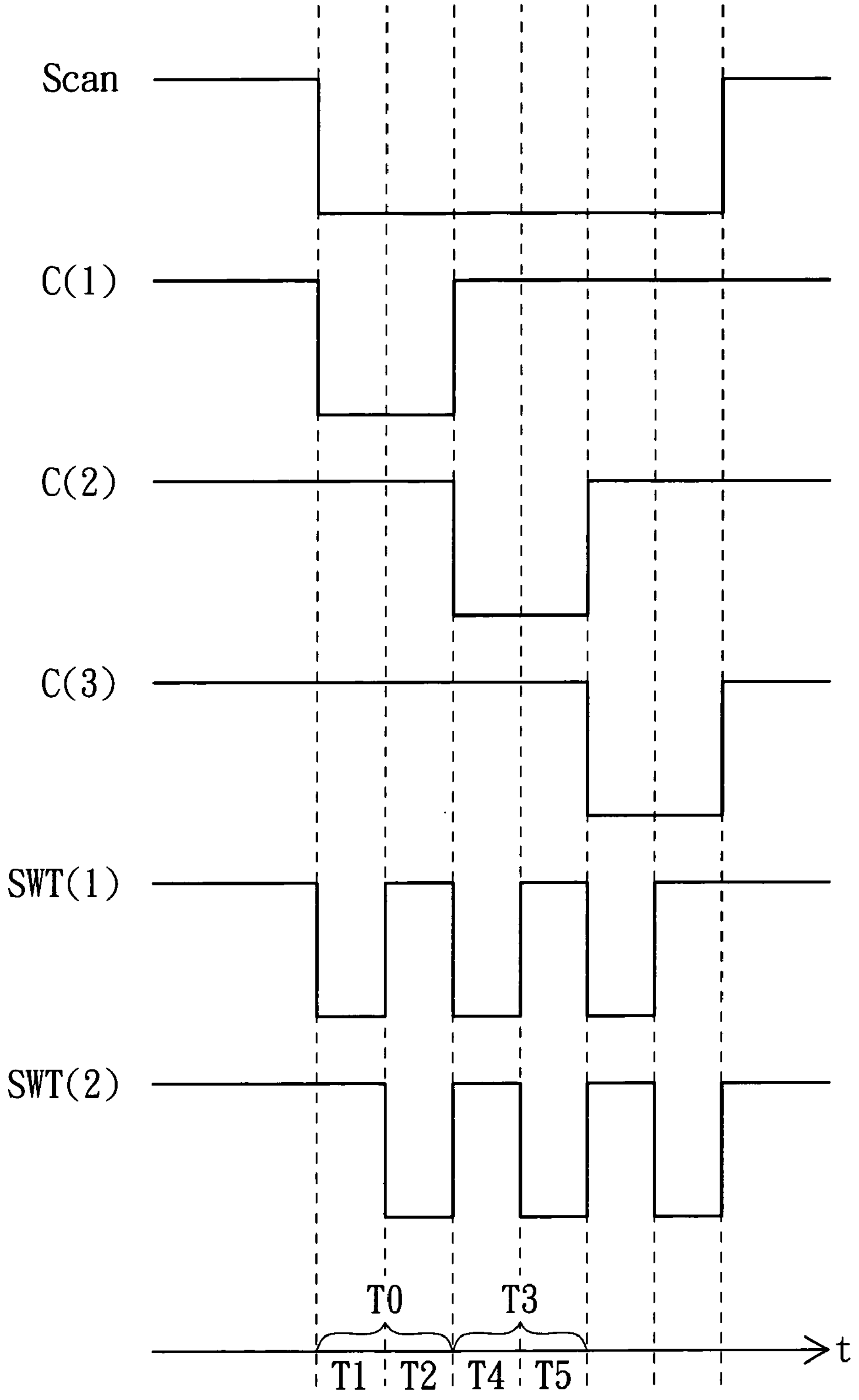
FIG. 3 is a timing chart showing control signals of a main thin-film transistor and an auxiliary thin film transistor.

FIG. 3 is a timing chart showing control signals of a main thin-film transistor and an auxiliary thin film transistor. As shown in FIG. 3, when six pixel circuits P(1) to P(6) in the same row receive the scan signal "scan", the main control signals C(1), C(2) and C(3) are sequentially enabled to turn on the corresponding main thin-film transistors TFT. When each main control signal C is enabled, two auxiliary control signals SWT(1) and SWT(2) are sequentially enabled in an enabled period of each main control signal C, such that only one pixel circuit P receives the pixel voltage transmitted from the test pad TP at a time instant. In detail, in the period T0 when the first main control signal C(1) is enabled, for example, the first auxiliary control signal SWT(1) is first enabled. In the period T1 when the first auxiliary control signal SWT(1) is enabled, the test pad TP receives a pixel voltage VP through a probe, for example. The pixel voltage VP is transmitted to the first pixel circuit P(1) through the first auxiliary thin film transistor $S_1$ and the first main thin-film transistor $TFT_1$(1). Next, in the period T2 when the first auxiliary control signal SWT(1) is disabled and the second auxiliary control signal SWT(2) is enabled, the pixel voltage VP received by the test pad TP is transferred to the fourth pixel circuit P(4) through the second auxiliary thin film transistor $S_2$ and the first main thin-film transistor $TFT_1$(2). Similarly, the pixel voltage VP is transferred to the pixel circuits P(2), P(3), P(5) and P(6) in a similar manner, and detailed descriptions thereof will be omitted.

Next, when the pixel voltage stored in each of the pixel circuits P(1) to P(6) is measured, the selector 202 and the auxiliary thin film transistors $S_1$ and $S_2$ are controlled according to the timings of FIG. 3. After each of the pixel circuits P(1) to P(6) receives the pixel voltage VP, the voltage level stored in each of the pixel circuits P(1) to P(6) is measured through the test pad TP so as to judge whether the voltage level is correct. Similarly, when each main control signal C is enabled, the two auxiliary control signals SWT(1) and SWT(2) are sequentially enabled in the enabled period of each main control signal C, such that only one pixel circuit P outputs the voltage level stored therein to the test pad TP at a time instant. In the enabled period T3 of the second main control signal C(2), the two auxiliary control signals SWT(1) and SWT(2) are respectively enabled in the periods T4 and T5. In the period T4, the test pad TP receives the voltage level stored in the second pixel circuit P(2) through the second main thin-film transistor $TFT_2$(1) and first auxiliary thin film transistor $S_1$, which are turned on. Then, the test pad TP receives the voltage level stored in the fifth pixel circuit P(5) through the second main thin-film transistor $TFT_2$(2) and the second auxiliary thin film transistor $S_2$, which are turned on, in the period T5. Similarly, the methods of measuring other pixel circuits P(1), P(3), P(5) and P(6) are similar and descriptions thereof will be omitted. Consequently, the voltage stored in only one pixel circuit P is measured at one time instant.

To sum up according to the test architecture for the display panel according to the embodiments of the invention, it is possible to correctly detect whether the function of each pixel circuit is normal when the glass substrate is manufactured (i.e., when the liquid crystal is not filled and the opposite glass substrate is not assembled). In other words, it is possible to screen the problematic pixel circuit in the front stage (array stage) in the manufacturing process of the liquid crystal display, and the production efficiency of the liquid crystal display may be enhanced. In addition, the invention may also greatly reduce the number of test pads disposed on the glass substrate so as to solve the problem of high cost and difficult process of manufacturing the test architecture of the conventional liquid crystal display panel.

Figure 4:
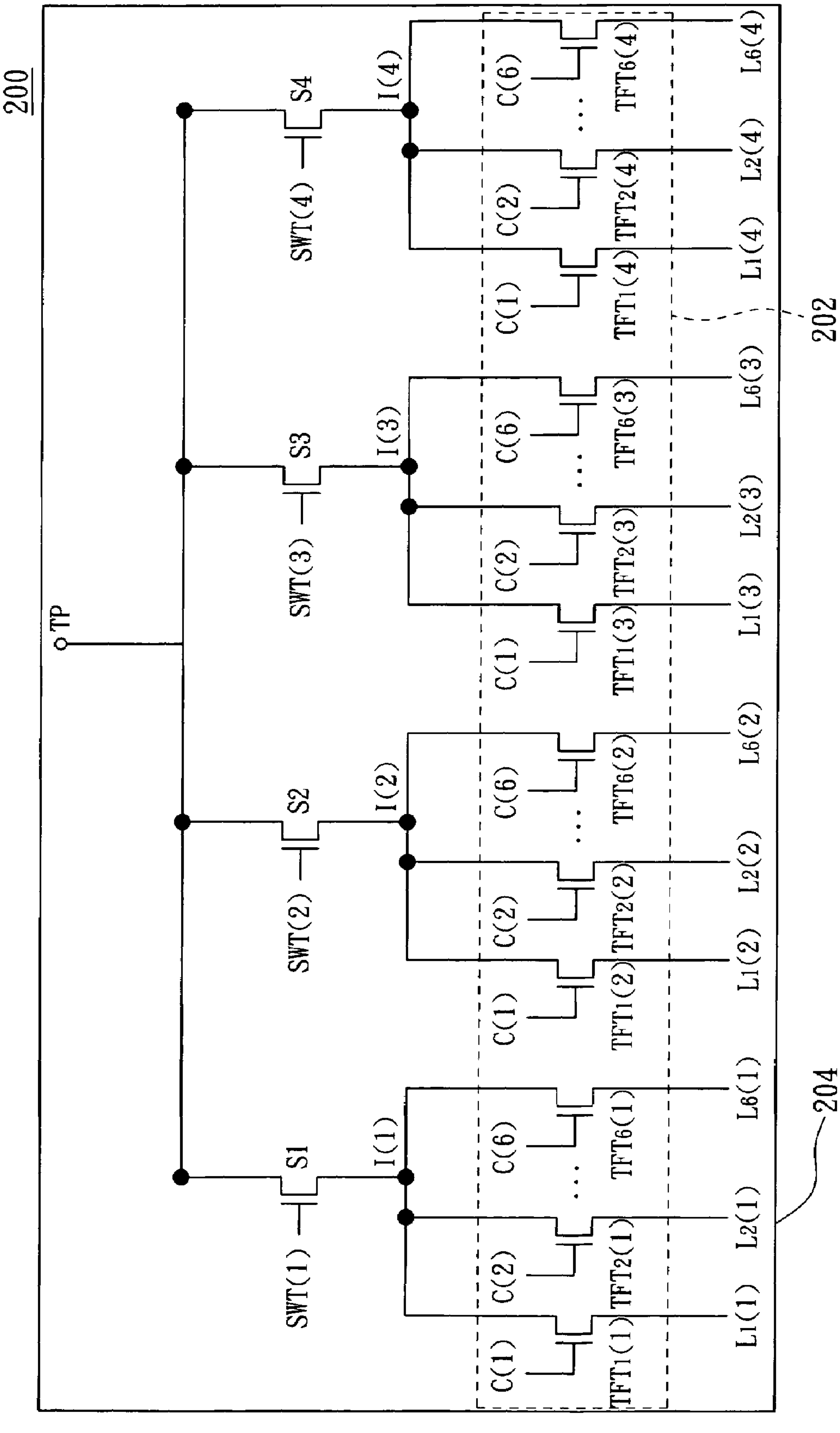
FIG. 4 is a schematic illustration showing another test architecture for the display device of the invention.

In addition, one IC pad corresponds to three data lines and two IC pads correspond to one test pad TP are described in the above-mentioned embodiment. However, an example in which one IC pad corresponds to six data lines and one test pad TP corresponds to four IC pads will be described. FIG. 4 is a schematic illustration showing another test architecture for the display device of the invention. Referring to FIG. 4, the glass substrate 204 is formed with 24 signal lines L, one selector 202, one test pad TP, four IC pads I(1), I(2), I(3) and I(4), one first auxiliary thin film transistor $S_1$, one second auxiliary thin film transistor $S_2$, one third auxiliary thin film transistor $S_3$ and one fourth auxiliary thin film transistor $S_4$. When each main control signal C is enabled, four auxiliary control signals SWT(1), SWT(2), SWT(3) and SWT(4) are sequentially enabled in the enabled period of each main control signal C, such that only one pixel circuit is electrically connected to the test pad TP at a time instant.

When the display device 200 operates normally, the voltage levels of the auxiliary control signals SWT are such that the auxiliary thin film transistors S are cut off. Thus, the data driving integrated circuit can drive the pixel circuits normally through the main thin-film transistor.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:

a plurality of first signal lines electrically connected to corresponding pixel circuits, respectively;

a plurality of second signal lines electrically connected to the corresponding pixel circuits, respectively;

a first main thin-film transistor set having a first main thin-film transistor and a second main thin-film transistor, each of which has a first terminal, a second terminal and a control terminal;

a second main thin-film transistor set having another first main thin-film transistor and another second main thin-film transistor, each of which has a first terminal, a second terminal and a control terminal, wherein the first terminals of the first main thin-film transistors are electrically connected to the first signal lines and the first terminals of the second main thin-film transistors are electrically connected to the second signal lines;

a test pad for receiving power signals for driving the pixel circuits and outputting voltage levels stored in the pixel circuits;

a first auxiliary thin film transistor having a first terminal, a second terminal and a control terminal, wherein the first terminal of the first auxiliary thin film transistor is electrically connected to the second terminals of the first main thin-film transistor set; and a second auxiliary thin film transistor having a first terminal, a second terminal and a control terminal, wherein the first terminal of the second auxiliary thin film transistor is electrically connected to the second terminals of the second main thin-film transistor set, the second terminals of the first auxiliary thin film transistor and the second auxiliary thin film transistor are coupled to the test pad, and the control terminals of the first auxiliary thin film transistor and the second auxiliary thin film transistor are adapted to receive corresponding auxiliary control signals, respectively.

2. The display device according to claim 1, wherein each of the control terminals of the first main thin-film transistors is configured to receive a main control signal, and each of the control terminals of the second main thin-film transistors is configured to receive another main control signal.

3. The display device according to claim 2, wherein the first main thin-film transistors are turned on when the main control signal is enabled, and the second main thin-film transistors is turned on when the another main control signal is enabled.

4. The display device according to claim 2, wherein the auxiliary control signals are sequentially enabled when the main control signal is enabled, such that the first auxiliary thin film transistor and the second auxiliary thin film transistor are sequentially turned on.

5. The display device according to claim 4, wherein the auxiliary control signals are sequentially enabled when the another main control signal is enabled, such that the first auxiliary thin film transistor and the second auxiliary thin film transistor are sequentially turned on.

6. The display device according to claim 1, further comprising a data driving integrated circuit, which is electrically connected to the second terminals of the first main thin-film transistor set and the second main thin-film transistor set, for driving the pixel circuits, wherein the first auxiliary thin film transistor and the second auxiliary thin film transistor are cut off when the data driving integrated circuit drives the pixel circuits.

7. The display device according to claim 1, wherein the pixel circuits, the first signal lines, the second signal lines, the first main thin-film transistor set, the second main thin-film transistor set, the first auxiliary thin film transistor, the second auxiliary thin film transistor and the test pad are formed on a glass substrate.

* * * * *